(12) United States Patent
Sawada et al.

(10) Patent No.: US 8,054,358 B2
(45) Date of Patent: Nov. 8, 2011

(54) SOLID STATE IMAGE PICKUP DEVICE

(75) Inventors: Hirokazu Sawada, Tsuchiura (JP); Jose Tejada, Tsuchiura (JP)

(73) Assignee: Texas Instruments Incorporated, Dallas, TX (US)

( * ) Notice: Subject to any disclaimer, the term of this patent is extended or adjusted under 35 U.S.C. 154(b) by 419 days.

(21) Appl. No.: 12/275,681

(22) Filed: Nov. 21, 2008

(65) Prior Publication Data

US 2009/0128679 A1 May 21, 2009

(30) Foreign Application Priority Data

Nov. 21, 2007 (JP) .................................. 2007-301122

(51) Int. Cl.
*H04N 3/14* (2006.01)
*H04N 5/335* (2006.01)

(52) U.S. Cl. ..................... 348/300; 348/302; 348/306

(58) Field of Classification Search .................. 348/294, 348/302, 308; 250/214.1
See application file for complete search history.

(56) References Cited

U.S. PATENT DOCUMENTS

| 6,831,685 | B1 * | 12/2004 | Ueno et al. ............... 348/302 |
| 2002/0134918 | A1 * | 9/2002 | Miida ..................... 250/214.1 |
| 2008/0062296 | A1 * | 3/2008 | Ogura et al. ............. 348/308 |
| 2008/0303058 | A1 * | 12/2008 | Mori et al. ............... 257/185 |

FOREIGN PATENT DOCUMENTS

| JP | 05-090556 | 4/1993 |
| JP | 2000-165754 | 6/2000 |
| JP | 2002-077737 | 3/2002 |
| JP | 2003-134396 | 5/2003 |
| JP | 2005-083790 | 3/2005 |
| JP | 2006-217410 | 8/2005 |
| JP | 2005-328493 | 11/2005 |

* cited by examiner

*Primary Examiner* — Gevell Selby
(74) *Attorney, Agent, or Firm* — Robert D. Marshall, Jr.; W. James Brady; Frederick J. Telecky, Jr.

(57) ABSTRACT

This invention improves linearity of a solid-state image pickup device beyond that of the prior art source follower to improve image quality. The image pickup device has plural pixels disposed in an array. Each pixel includes: a photodiode (PD); a transfer transistor (Tr1); a floating diffusion (FD); and an amplification transistor (Tr4). A compensating circuit has an amplifier (AP) receiving the output of the amplification transistor (Tr4), and a compensating transistor (M2) matched to the pixel amplification transistor (Tr4). Compensation is provided using negative feedback in the amplifier (AP).

17 Claims, 7 Drawing Sheets

SOLID STATE IMAGE PICKUP DEVICE

CLAIM OF PRIORITY

This application claims priority under 35 U.S.C. 119(a) to Japanese Patent Application No. 2007 301122 filed Nov. 21, 2007.

TECHNICAL FIELD OF THE INVENTION

The technical field of this invention is a solid-state image pickup device. Especially, the present invention pertains to a CMOS type or CCD type solid-state image pickup device.

BACKGROUND OF THE INVENTION

There is an increasing demand for improved characteristics for CMOS (Complementary Metal Oxide Semiconductor) image sensors, CCD (Charge Coupling Device) image sensors and other image input image sensors used in digital cameras, camera-attached cell phones and other applications.

A very important factor in such CMOS image sensors or other solid-state image pickup devices is whether the signal charge obtained at the photodiode of each pixel can be transferred to the output without any loss. This character determines the image quality. The linearity between the voltage corresponding to the signal charge and the output voltage from the pixel is thus an important factor.

FIG. 11 is a circuit diagram illustrating a source follower circuit used for reading the charge accumulated in each pixel as a voltage. This source follower includes one NMOS transistor M1. The gate electrode of transistor M1 is connected to a floating diffusion region that stores the charge of each pixel. The voltage $V_{in}$ corresponds to the stored charge. A predetermined voltage VR is applied via a selecting transistor not shown to one end of the source/drain path. The other end of the source/drain path connects to output line $V_{out}$. When transistor M1 is saturated, the gate-source voltage $V_{gs}$ equals threshold voltage $V_{th}\{V_{out}\}$. The output voltage $V_{out}$ becomes $V_{in} - V_{th}\{V_{out}\}$.

In such a source follower circuit, the source voltage differs from the body voltage. Consequently, $V_{th}$ is influenced by the bias of the substrate as shown in equation (1).

$$V_{th} = V_{th0} + \gamma\left(\sqrt{|2\Phi_F + V_{out}|} - \sqrt{|2\Phi_F|}\right) \text{ where:} \quad (1)$$

$$\gamma = \sqrt{\frac{2q\varepsilon_{Si}N_{sub}}{C_{ox}}} \quad (2)$$

$$\Phi_F = \frac{kT}{q}\ln\left|\frac{N_{sub}}{n_i}\right| \quad (3)$$

q is the elementary charge; $\varepsilon_{Si}$ is the dielectric constant of silicon; $N_{sub}$ is impurity concentration in the substrate; $C_{ox}$ is the capacitance of the gate oxide film; $n_i$ is the true carrier density; k is the Boltzmann constant; and T represents the absolute temperature.

According to these equations $V_{th}$ is a function of the output voltage and does not have a constant value. This leads to deterioration in the linearity between the voltage of the signal charge and output voltage of the pixel. As a result, the image quality of the solid-state image pickup device depends upon the performance of the source follower.

It is possible to avoid the influence of the substrate bias by setting the source and the body at the same voltage. However, this requires a large area to form a well for element separation. Consequently, it is difficult use this scheme in a CMOS image sensor where the pixel size must be small.

The problem addressed by the present invention is improving the linearity of the source follower in a CMOS image sensor or other solid-state image pickup device to improve the image quality.

SUMMARY OF THE INVENTION

This invention is a solid-state image pickup device including: plural pixels integrated in an array configuration on a semiconductor substrate, each pixel having a photodiode that receives light, generates and stores a photoelectric charge, a transfer transistor that transfers photoelectric charge from the photodiode, a floating diffusion that transfers the photoelectric charge via the transfer transistor and an amplification transistor having a gate electrode connected to the floating diffusion; a compensating circuit having an amplifier receiving the output of the amplification transistor as input and a compensating transistor having a gate electrode connected to the output of the amplifier with negative feedback of the output of the compensating transistor to the amplifier.

The amplification transistor and the compensating transistor preferably have substantially the same ratio of gate width to gate length. The current source for the amplification transistor and the current source for the compensating transistor preferably have substantially the same current.

The compensating circuit is preferably set for each column of the pixels integrated in an array configuration.

The pixel preferably has a selecting transistor connected in series with the amplification transistor for selecting the pixel according to a selection driving line input.

The pixel preferably also has an additive capacitance element connected to the photodiode via the floating diffusion storing the photoelectric charge transferred via the transfer transistor from the photodiode and a capacitive coupling transistor that couples or separates the floating diffusion and the additive capacitance element.

The pixel preferably also has a reset transistor connected to the additive capacitance element or the floating diffusion for discharge of photoelectric charge in the additive capacitance element and/or the floating diffusion.

In a second embodiment the solid-state image pickup device includes: M×N image pickup elements set in a matrix configuration with M and N being integers greater than 2; N output circuits for receiving the outputs of the image pickup elements; each the image pickup element having a photodiode, a floating diffusion region, a transfer transistor for transferring electric charge from the photodiode to the floating diffusion region, a reset transistor for resetting the potential of the floating diffusion region, an amplification transistor having a control terminal connected to the floating diffusion region and outputting a voltage corresponding to the potential of the floating diffusion region, and a selecting transistor connected in series with the amplification transistor selecting the image pickup element; each the output circuit has an amplifier with and input receiving the output of the amplification transistor, and an output transistor having its control terminal connected to the output of the amplifier with its output fed to the other input of the amplifier; the structure of the amplification transistor of the image pickup element and the output transistor of the output circuit being the same; and the output of the amplifier is fed as the output of the image pickup element.

In a third embodiment of the solid-state image pickup device includes: a pixel region with M×N pixels set in a matrix configuration where M and N are integers 2 or more; N amplifiers for receiving the outputs of the Mth row of pixels as one input and selectively receiving the outputs of the 1st through (M−1)th rows of pixels as another input; each pixel having a photodiode, a floating diffusion region, a transfer transistor for transferring electric charge from the photodiode to the floating diffusion region, a reset transistor for resetting the potential of the floating diffusion region and an amplification transistor having its control terminal connected to the floating diffusion region for outputting a voltage corresponding to the potential of the floating diffusion region; the output of the amplifier being fed to the control terminal of an amplification transistor of the Mth row of pixels; and the N amplifiers are respectively set as a row corresponding to the Mth row of pixels.

The solid-state image pickup device of the present invention has a compensating circuit set on the output side of an amplification transistor. This improves the linearity between the voltage corresponding to the signal charge and the output voltage from the pixel enabling improved image quality.

BRIEF DESCRIPTION OF THE DRAWINGS

These and other aspects of this invention are illustrated in the drawings, in which.

DETAILED DESCRIPTION OF PREFERRED EMBODIMENTS

In the following Figures: PX is a pixel; CC, CC1 and CC2 are compensating pixels; DC, DC1 and DC2 are dummy pixels; Tr1 is a transfer transistor; Tr2 is a capacitive coupling transistor; Tr3 is a reset transistor; Tr4(M1) is an amplification transistor; Tr5 is a selecting transistor; AP is an amplifier; M2 is a compensating transistor; VR is a power source voltage; $\phi_T$, $\phi_S$, $\phi_R$, $\phi_X$, $\phi_{S1+N1}$, $\phi_{N1}$, $\phi_{S1'+S2'+N2}$, $\phi_{N2}$ and $\phi_{XCLR}$ are driving lines; SL is a selecting line; $SR^H$ is a column shift register; $SR^V$ is a row shift register; AM is an analog memory; $C_S$ is an additive capacitance element; FD is a floating diffusion; and PD is a photodiode. The following explains embodiments of the solid-state image pickup device of this invention with reference to the Figures.

The solid-state image pickup device of a first embodiment is a CMOS image sensor with a wide dynamic range.

Figure 1:
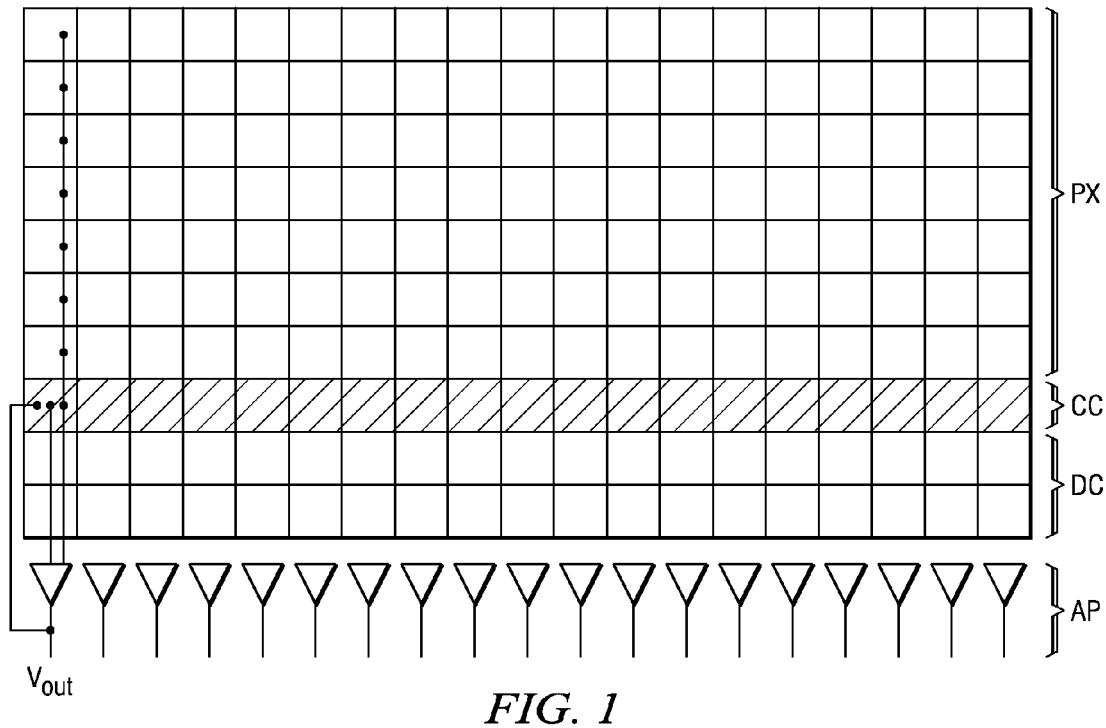
FIG. 1 is a plan view illustrating the layout of the CMOS image sensor of a first embodiment of the present invention.

FIG. 1 is a plan view illustrating the layout of the CMOS image sensor of this first embodiment. Plural image elements (pixels) PX each include a photodiode, a transfer transistor, a floating diffusion (floating diffusion region) and an amplification transistor disposed on a semiconductor substrate and integrated to form an array of M rows and N columns. A compensating circuit for each column of the pixels PX is integrated in the array configuration. The compensating circuit includes an amplifier receiving as input the output of the amplification transistor and a compensating transistor having its gate connected to the output of the amplifier. The compensating circuit has negative feedback where the output of the compensating transistor is fed back to the amplifier. The compensating transistor is included in a compensating pixel CC having the same construction as an image pixel PX. The amplifier is included with the pixel region on the outer side of the pixel region containing pixels PX and compensating pixels CC. The compensating transistor in the compensating pixel CC corresponds to the amplification transistor in pixel PX.

Dummy pixels DC are disposed adjacent to compensating pixel CC. Dummy pixel DC has the same construction as pixel PX. Dummy pixels DC are used for measuring the black level. Compensating pixels CC and dummy pixels DC in dummy regions not shown in FIG. 1 have the same construction as pixels PX and are disposed as needed in the periphery of the array-configuration pixels PX. Dummy regions improve the processing stability in the manufacturing process.

Figure 2:
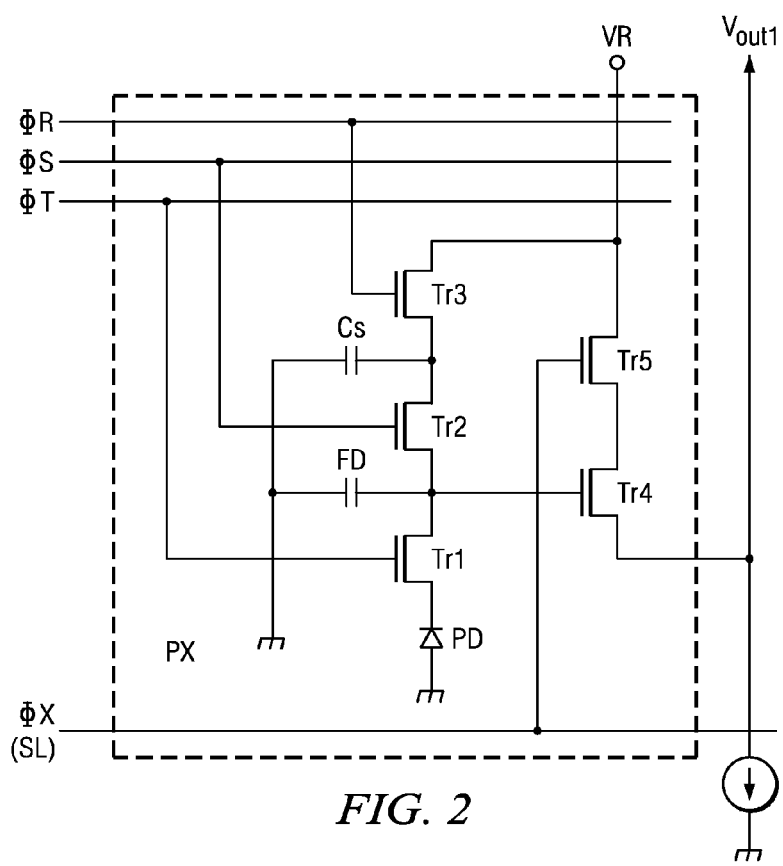
FIG. 2 is a circuit diagram equivalent to FIG. 1 illustrating a pixel of a CMOS image sensor.

FIG. 2 is an equivalent circuit diagram illustrating one pixel PX of a CMOS image sensor in the solid-state image pickup device of this first embodiment. The pixel PX is a so-called 5-transistor type CMOS image sensor including: photodiode PD that receives light, generates and stores photoelectric charge; transfer transistor Tr1 that transfers the photoelectric charge from the photodiode PD; floating diffusion FD that transfers the photoelectric charge through the transfer transistor Tr1; additive capacitance element Cs; capacitive coupling transistor Tr2 that couples or separates the capacitance of floating diffusion FD and additive capacitance element Cs; reset transistor Tr3 connected to floating diffusion FD for discharge of the photoelectric charge in the floating diffusion FD; amplification transistor (also known as source follower transistor) Tr4 with its gate electrode connected to floating diffusion FD to amplify and convert the photoelectric charge in floating diffusion FD to a voltage signal; and selecting transistor Tr5 connected in series with the amplification transistor Tr4 for selecting the pixel. All the five transistors may be n-channel MOS transistors. Compensating pixel CC and dummy pixel DC have the same circuit construction as pixel PX.

In this first embodiment, plural pixels are integrated in an array on the light receiving surface. For each pixel, driving line $\phi_T$ is connected to the gate of transfer transistor Tr1, driving line $\phi_S$ is connected to the gate of capacitive coupling transistor Tr2 and driving line $\phi_R$ is connected to the gate electrodes of reset transistor Tr3. Pixel selecting line $\phi_X$ (SL)

is driven by a row shift register and is connected to the gate electrode of selecting transistor Tr5. A predetermined supply voltage VR supplies one of the terminal of the source/drain paths of reset transistor Tr3 and selecting transistor Tr5. An output-side of the source/drain path of amplification transistor Tr4 is connected to output line $V_{out1}$. Amplification transistor Tr4 is controlled by selecting transistor Tr5 via pixel selecting line $\phi_X$ (SL) controlled by a column shift register and outputs a voltage signal.

Figure 3:
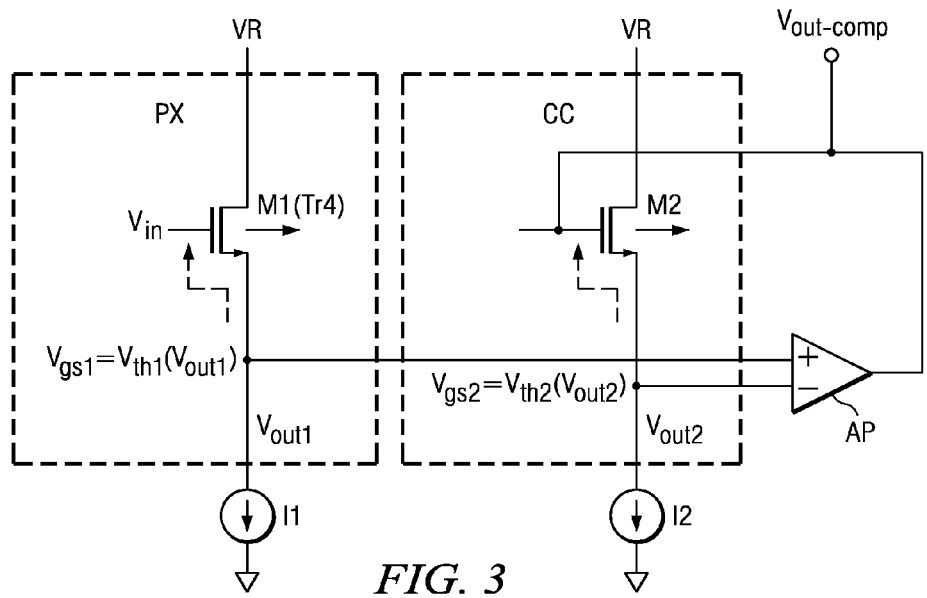
FIG. 3 is a diagram illustrating the equivalent circuit of the amplification transistor (source follower transistor) and the compensating circuit of each pixel of FIG. 1.

FIG. 3 is an equivalent circuit diagram illustrating the amplification transistor (source follower transistor) Tr4 (M1) and the compensating circuit that forms pixel PX of this embodiment. The compensating circuit receives the output side amplification transistor Tr4 (M1). The compensating circuit includes amplifier AP. Amplifier AP has a non-inverting input receiving the output of amplification transistor Tr4. Compensating transistor M2 is connected similarly to amplification transistor Tr4. Compensating transistor M2 has a gate electrode connected to the output of amplifier AP. The output of compensating transistor M2 supplies an inverting input of amplifier AP. Amplifier AP may also be an op-amp (operational amplifier).

Prescribed supply voltage VR is supplied to one terminal of the source/drain path of amplification transistors Tr4 (M1) and of compensating transistor M2. Amplification transistor Tr4 (M1) and compensating transistor M2 preferably have the same construction including substantially the same ratio of gate width to gate length. Current source I1 connected to amplification transistor Tr4 (M1) and current source I2 connected to compensating transistor M2 have substantially the same current. Thus pixel PX and compensating pixel CC have the same construction, and amplification transistor M1 and compensating transistor M2 have a corresponding relationship to each other.

A circuit having a compensating circuit including compensating pixels CC for each column of pixels PX may have dummy pixels DC. Compensating pixels CC disposed near these dummy pixels DC have the same construction as previously described and are used as compensating transistors to compensate the transistors corresponding to the amplification transistors of the dummy pixels DC.

Using a compensating circuit for each column of pixels PX integrated in an array results in reduced area needed for the compensating circuits as compared with the case of compensating circuit for each pixel.

FIG. 3 shows gate-source voltage $V_{gs1}$ with respect to source voltage $V_{out1}$ of amplification transistor Tr4 (M1) is equal to threshold voltage $V_{th1}$ which depends upon source voltage $V_{out1}$ expressed as $V_{th1}\{V_{out}\}$. Gate-source voltage $V_{gs2}$ with respect to source voltage $V_{out2}$ of compensating transistor M2 is equal to threshold voltage $V_{th2}$ which depends upon source voltage $V_{out2}$ expressed as $V_{th2}\{V_{out2}\}$. Here input voltage $V_{in}$ to the gate of amplification transistor Tr4 (M1) which corresponds to the charge accumulated in the floating diffusion, source voltage $V_{out1}$ of amplification transistor Tr4 (M1) is represented by equation (4).

$$V_{out1}=V_{in}-V_{th1}\{V_{out1}\} \tag{4}$$

Assuming that the amplification ratio of amplifier AP of the compensating circuit is A, feedback illustrated in FIG. 3 results in the relationship of equation (5). The output of amplifier AP equals the voltage on the gate of compensating transistor M2.

$$A(V_{out1}-V_{out2})=V_{out2}+V_{th1}\{V_{out2}\} \tag{5}$$

Solving equation (5) for $V_{out2}$ yields equation (6).

$$V_{out2} = \frac{A}{1+A}V_{out1} + \frac{1}{1+A}V_{th2}\{V_{out2}\} \tag{6}$$

If the amplification rate A of amplifier AP is sufficiently high, output $V_{out2}$ of compensating transistor M2 can be represented by equation (7).

$$V_{out2} \approx V_{out1} \text{ for } (A \to \infty) \tag{7}$$

The output $V_{1in}$ of amplifier AP being $V_{out2}+V_{th2}\{V_{out2}\}$ is represented by equation (8). Thus output $V_{1in}$ of amplifier AP is nearly equal to voltage $V_{in}$ supplied to the gate of amplification transistor Tr4 (M1).

$$\begin{aligned}
V_{1in} &= V_{out2} + V_{th2}\{V_{out2}\} \\
&\approx V_{out1} + V_{th2}\{V_{out1}\} \\
&\approx V_{out1} + V_{th1}\{V_{out1}\} \\
&= V_{in}
\end{aligned} \tag{8}$$

In the equation (8), the approximations made for the first two lines result from the fact that when the amplification rate A of amplifier AP is sufficiently high $V_{out2}$ approximates $V_{out1}$ as noted in equation (7). The approximations made for the second and third lines result from matching amplification transistor Tr4 (M1) and compensating transistor M2 and thus $V_{th1}$ equals $V_{th2}$ with these threshold voltages also includes a substrate bias effect.

Equation (8) shows output $V_{1in}$ of amplifier AP follows voltage $V_{in}$ applied to the gate of amplification transistor Tr4 (M1). Using the $V_{1in}$ as compensated output $V_{out\text{-}comp}$ of the pixel shown in FIG. 3 makes it possible to improve the linearity characteristics between the voltage corresponding to the signal charge and the output voltage from the pixel. This improves image quality.

Figure 11:
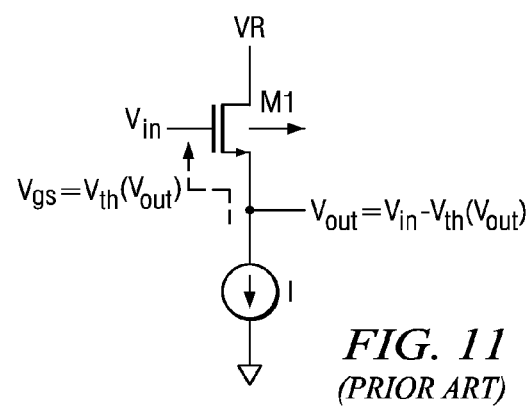
FIG. 11 illustrates a circuit diagram of the prior art showing a source follower for reading the charge accumulated in each pixel of a solid-state image pickup device as a voltage.

FIG. 11 shows the case of a circuit in the prior art. Equation (9) represents the linearity of this prior art circuit from equations (1) and (4).

$$\begin{aligned}
\frac{\partial V_{out}}{\partial V_{in}} &= \frac{\partial}{\partial V_{in}}\left[V_{in} - \left(V_{th0} + \gamma\left(\sqrt{|2\Phi_F + V_{out}|} - \sqrt{|2\Phi_F|}\right)\right)\right] \\
&= 1 - \gamma\frac{1}{2\sqrt{|2\Phi_F + V_{out}|}}\frac{\partial V_{out}}{\partial V_{in}} \\
&= \frac{1}{1 + \frac{\gamma}{2\sqrt{|2\Phi_F + V_{out}|}}}
\end{aligned} \tag{9}$$

Equation (9) shows the linearity differs for different output voltages $V_{out}$. Equation (9) also shows this linearity is less than one.

Equation (10) shows the linearity of the circuit of this embodiment computed from the equation (8).

$$\frac{\partial V_{1in}}{\partial V_{in}} = 1 \tag{10}$$

Thus in this present embodiment, the linearity has no voltage dependence and has a theoretical value of one.

In the prior art CMOS image sensor, the linearity of the output of amplification transistor Tr4 (M1) in pixel PX is degraded due to a conventional back gate effect. However, it is possible to correct the output using a compensating circuit containing compensating transistor M2 disposed on the same integrated circuit. Because amplification transistor Tr4 (M1) and compensating transistor M2 are formed on the same integrated circuit, it is possible to closely match their characteristics and thus reduce manufacturing error. Complicated linearity correction is not necessary in post operation. The operation is simpler and the cost is reduced.

In the following describes the overall circuit construction of a CMOS image sensor having pixels integrated in an array.

Figure 4:
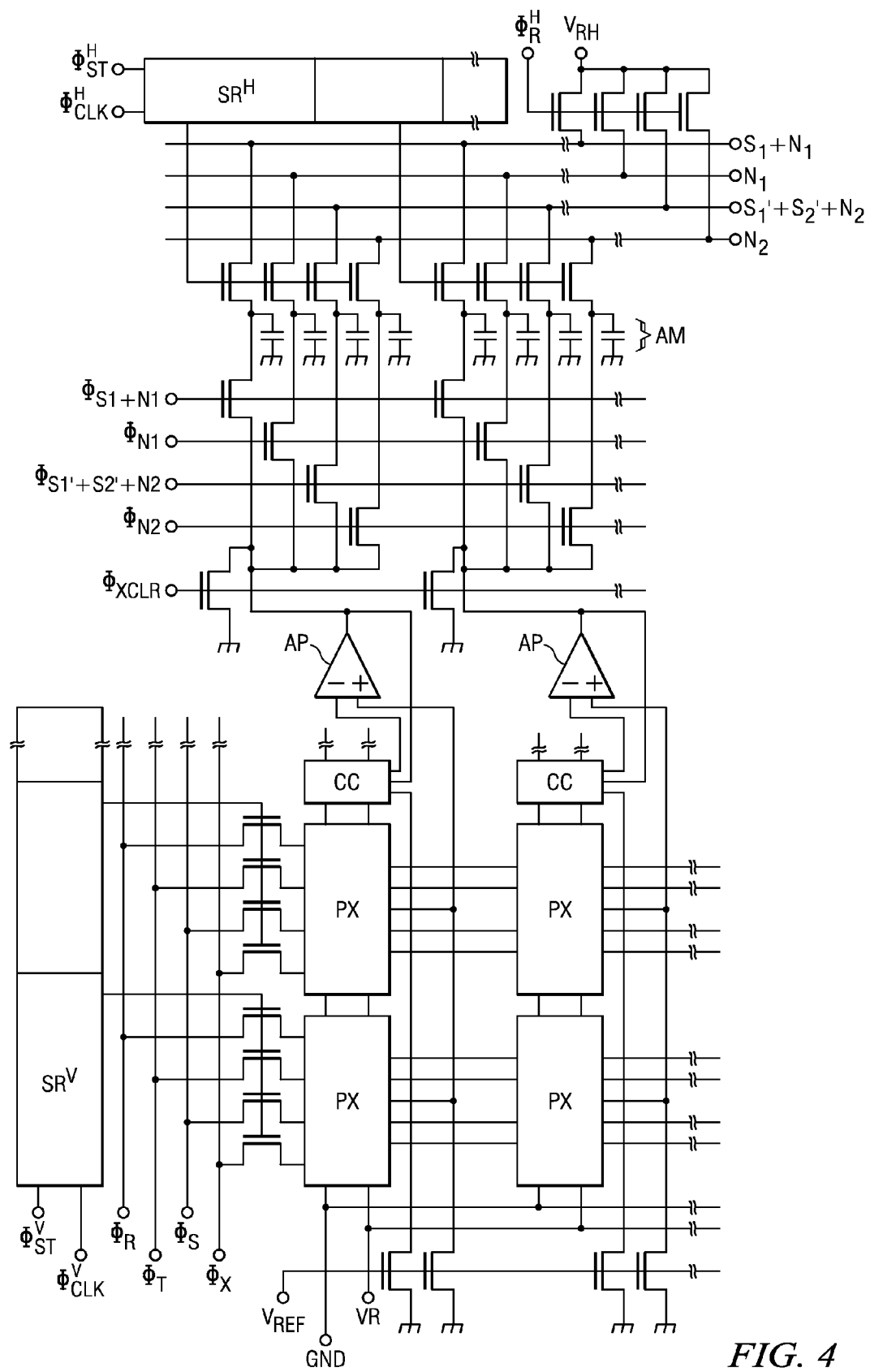
FIG. 4 is an circuit diagram illustrating the circuit of the overall CMOS image sensor in the first embodiment of this invention.

FIG. 4 is an equivalent circuit diagram illustrating the overall circuit construction of the CMOS image sensor in the present embodiment.

Plural pixels PX are disposed in an array. FIG. 4 illustrates four pixels. Pixels PX are connected to driving lines $\phi_T$, $\phi_S$, $\phi_R$ and $\phi_X$ having signals generated by row shift register $SR^V$, to power source voltage VR and to ground GND.

Compensating circuits each containing compensating pixel CC and amplifier AP are disposed adjacent to the array-shaped pixels PX.

The outputs from various pixels PX are controlled by column shift register $SR^H$ and driving lines ($\phi_{S1+N1}$, $\phi_{N1}$, $\phi_{S1'+S2'+N2}$, $\phi_{N2}$) These outputs are compensated by corresponding compensating circuits. Driving line $\phi_{XCLR}$, controls the output of signals to analog memory AM from the various output lines at respective timings. These signals include modulated pre-saturation charge signal $(S_1)+C_{FD}$, noise $(N_1)$, $C_{FD}$ noise $(N_1)$, modulated pre-saturation charge signal $(S_1)$+modulated over-saturated charge signal $(S_2)+C_{FD}+C_S$ noise $(N_2)$ and $C_{FD}+C_S$ noise $(N_2)$.

In a solid-state image pickup device with a CMOS image sensor as in the present embodiment, it is possible to adopt a construction achieving a wide dynamic range with each pixel having a floating diffusion and an additive capacitance element such as disclosed in Japanese Kokai Patent Application No. 2005-328493. It is also possible to use the driving method disclosed in Japanese Kokai Patent Application No. 2005-328493. From these results, pre-saturation charge signal $(S_1)$ and over-saturation charge signal $(S_2)$ can be obtained. A CMOS image sensor having a wide dynamic range can be realized by selecting and using any of the first signal (pre-saturation charge signal $(S_1)$) or the second signal (pre-saturation charge signal $(S_1)$+over-saturation charge signal $(S_2)$).

It is possible to improve the linearity between the signal charge voltage and the output voltage from the pixel for the solid-state image pickup device of the present embodiment by disposing a compensating circuit on the output side of the amplification transistor. Thus it is possible to improve image quality.

Figure 5:
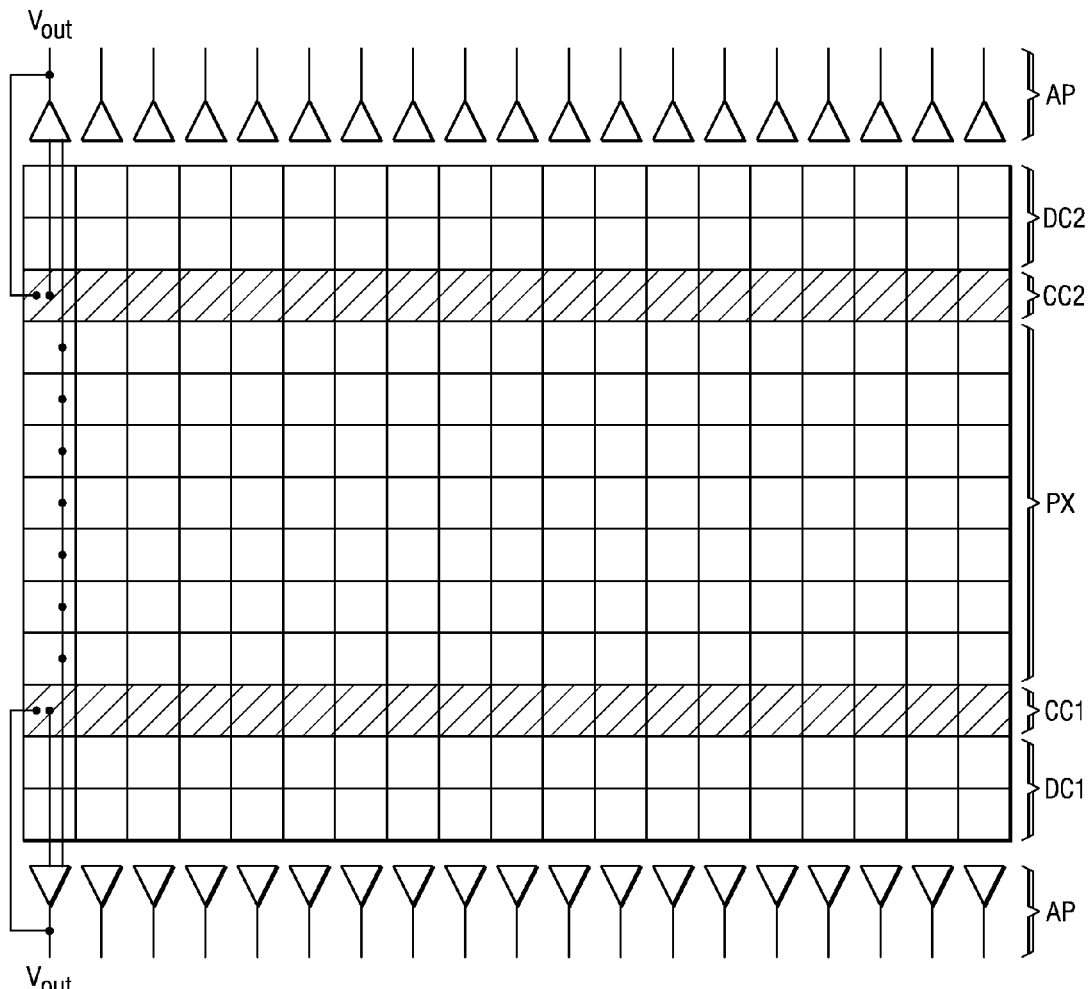
FIG. 5 is a plan view illustrating the layout of the CMOS image sensor of a second embodiment of this invention.

FIG. 5 is a plan view illustrating the layout of a CMOS image sensor pertaining to another embodiment of this invention.

Just as in the first embodiment, pixels PX are integrated in an array. Two compensating pixels (CC1, CC2) are disposed at the upper end and lower end of a column of pixels PX in the adjacent portions of the array. FIG. 5 illustrates two dummy pixel regions (DC1, DC2). Two sets of compensating pixels CC1 and CC2 interface with amplifiers AP set along outer side of the pixel region.

For each of the pixels, a high sensitivity mode outputs a first signal (pre-saturation charge signal $(S_1)$) and a low sensitivity mode outputs a second signal (pre-saturation charge signal $(S_1)$+over-saturation charge signal $(S_2)$). The user can switch between the two dynamic ranges modes corresponding to the specific scene of the picture. In the high sensitivity mode, the output of the first signal (pre-saturation charge signal $(S_1)$) is maintained via compensating pixel CC1. In the low sensitivity mode, the output of the second signal (pre-saturation charge signal $(S_1)$+over-saturation charge signal $(S_2)$) is maintained via compensating pixel CC2.

Figure 6:
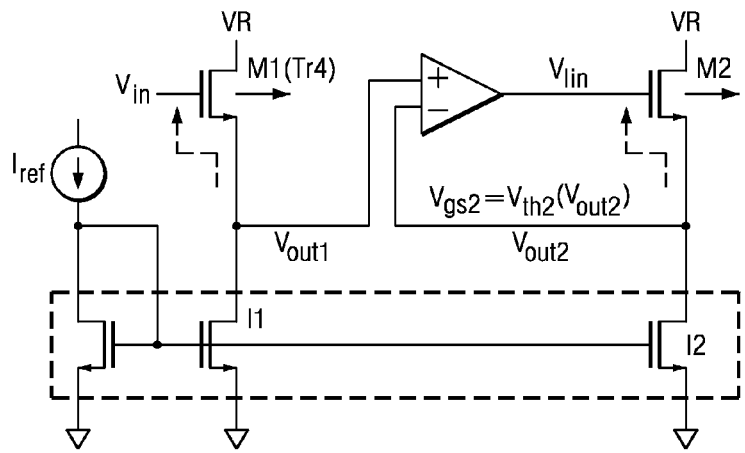
FIG. 6 is a circuit diagram used in simulation of an embodiment of this invention.

The improvement in the linearity for the solid-state image pickup device of this embodiment has been checked via simulation. FIG. 6 is a circuit diagram illustrating a circuit for performing the simulation. It has the same construction as shown in FIG. 3, except that current sources I1 and I2 are replaced with more realistic current mirror transistor circuits. The simulation test defines the linearity. The slope of the output curve at an input reference voltage (2.7 V) is determined plotting a curve having the desired slope passing through the point of the reference voltage.

The linearity error is defined as the proportion of deviation from the aforementioned obtained straight line (theoretical value), and it is defined by following equation (11).

$$\text{Linearity Error} = \frac{V_{out}\{V_{in}\} - V_{ideal}\{V_{in}\}}{V_{out}\{V_{in}\}} \tag{11}$$

As seen in equation (11), the linearity error is a function of input voltage $V_{in}$. The linearity error tends to increase as the input voltage deviates from the reference voltage.

Figure 7A:
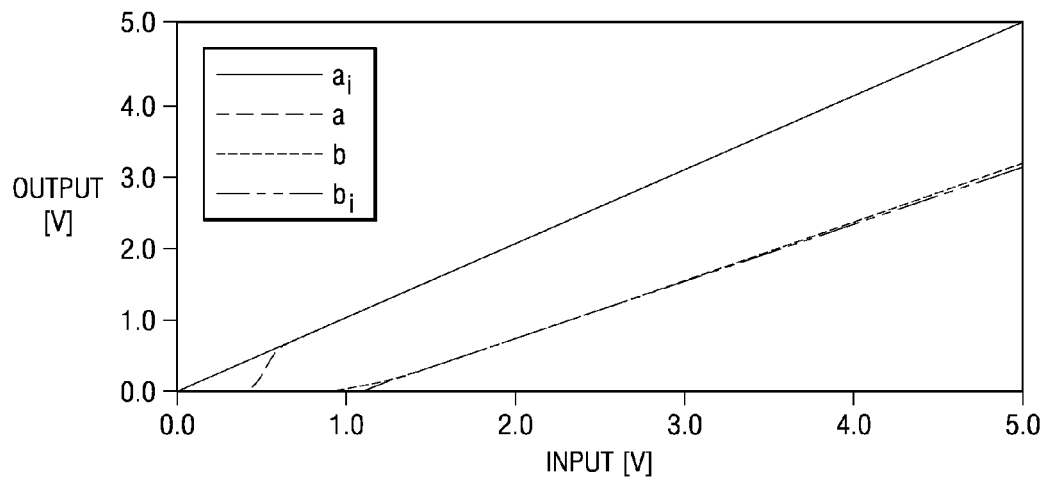
FIG. 7(a) shows the input-output curve in the first embodiment of this invention.

FIG. 7(a) shows output (V) versus input (V) of the CMOS image sensor in the present embodiment and that in the prior art. Curve (a) shows the input-output curve in the this embodiment compared with straight line ($a_i$) as its theoretical value. Curve (b) shows the input-output curve of the prior art compared with straight line ($b_i$) as its theoretical value.

Figure 7B:
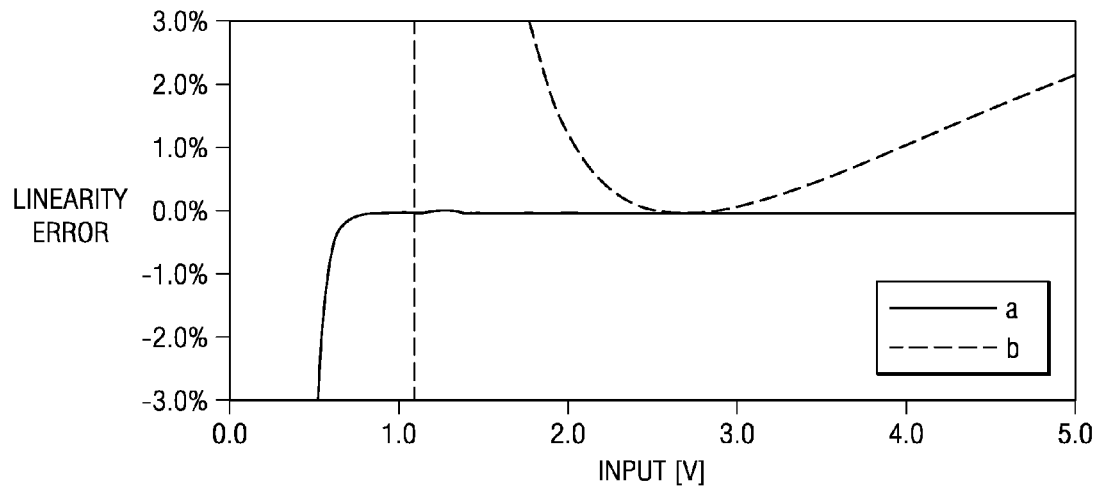
FIG. 7(b) shows the linearity error in the first embodiment of this invention.

FIG. 7(b) shows the linearity error of output (V) versus input (V) for CMOS image sensors in the present embodiment and in the prior art. Curve (a) shows the linearity error of the present embodiment. Curve (b) shows the linearity error in the prior art.

FIG. 7(b) shows the linearity error varies corresponding to the input value in the prior art. FIG. 7(b) also shows the dependence of the linearity error on the input value is smaller in the present embodiment. In the operation region where a bias current source operates, the linearity error is approximately 0 with high stability.

Considering any mis-match between amplification transistor Tr4 (M1) and compensating transistor M2, equation (8) indicates correction should be made so that $V_{th1}$ is approximately $V_{th2}$. In this case, $V_{1in}$ is shown by equation (12).

$$V_{in}=V_{FD}+[V_{th2}\{V_{out}\}-V_{th1}\{V_{out}\}] \tag{12}$$

The second term in the brackets in the equation (12) is the error. This influence has been checked by Monte Carlo simulation.

Figure 8A:
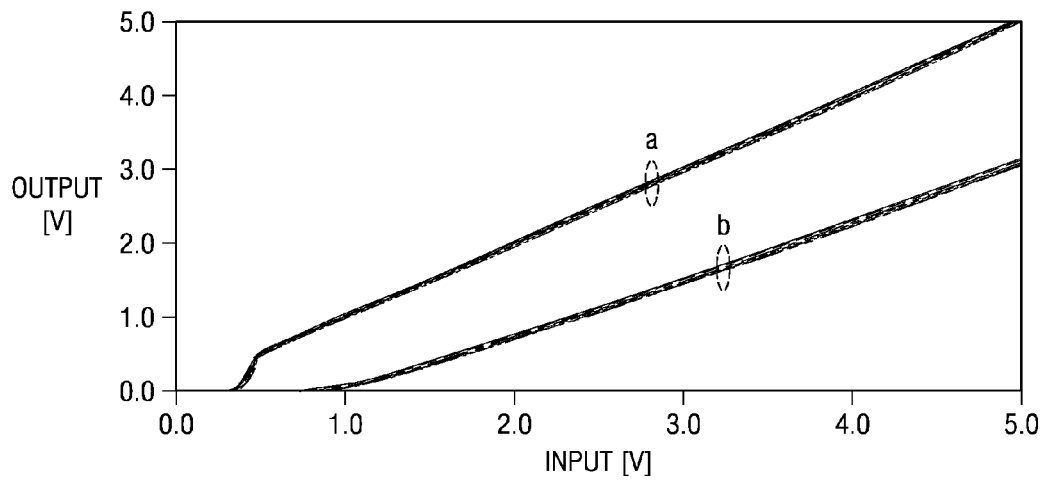
FIG. 8(a) shows the input-output curve in the second embodiment of this invention.

FIG. 8(a) shows output (V) versus input (V) of CMOS image sensors in the present embodiment and in the prior art. Curve (a) shows the input-output curve in the present embodiment. Curve (b) shows the input-output curve of the prior art.

Figure 8B:
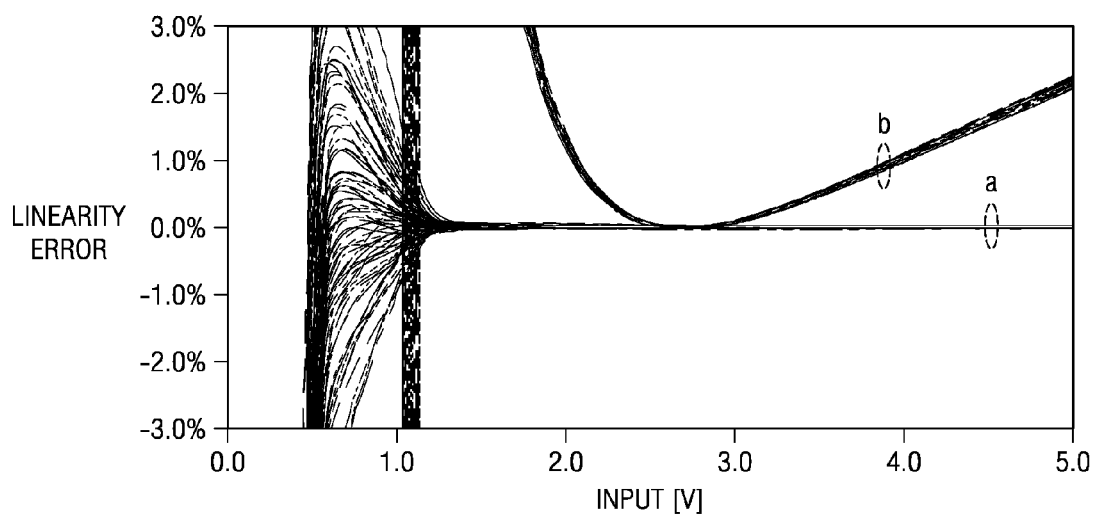
FIG. 8(b) shows the linearity error in the second embodiment of this invention.

FIG. 8(b) shows the linearity error of output (V) versus input (V) of CMOS image sensors in the present embodiment and in the prior art. Curve (a) shows the linearity error in the present embodiment. Curve (b) shows the linearity error straight line in the prior art.

As can be seen from FIG. 8(a), the dispersion in the output is a little larger than in FIG. 7(b). This can be predicted from the fact that two $V_{th}$ terms are included in the equation (11). This dispersion is cancelled in the differential treatment causing no problem.

From FIG. 8(b), it can be seen that in the present embodiment, the dispersion in the linearity error is not significant. This is because the two differential signals are treated by the same amplification transistor Tr4(M1) and compensating transistor M2. As a result, the dispersion in the reference point is cancelled. Thus in this embodiment the influence of non-matching is hardly felt.

It has been assumed in the explanation above that the gain of the amplifier contained in the compensating circuit for each pixel column is infinite. However, it is actually finite and this is examined here.

Figure 9A:
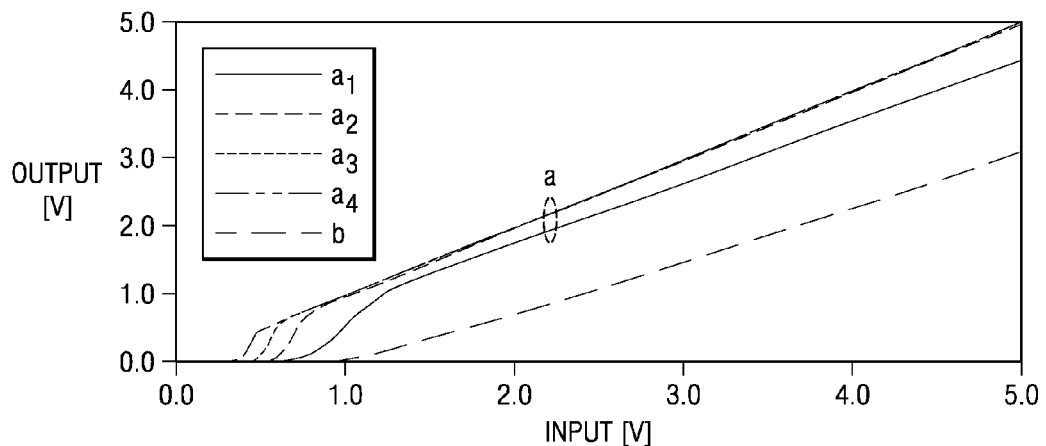
FIG. 9(a) shows the input-output curve in the third embodiment of this invention.

FIG. 9(a) shows the output (V) versus the input (V) of CMOS image sensors in the present embodiment and in the prior art. Curve (a) shows the input-output curve in the present embodiment. Curve ($a_1$) corresponds to a gain of 10×, ($a_2$) corresponds to a gain of 100×, curve ($a_3$) corresponds to a gain of 1000× and curve ($a_4$) corresponds to a gain of 10,000×. Curve (b) shows the input-output curve in the prior art.

Figure 9B:
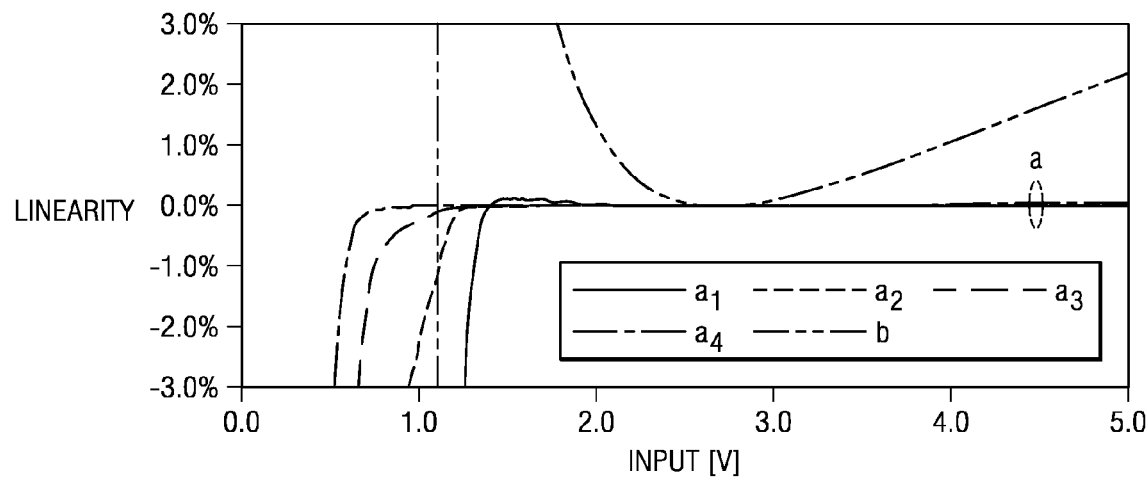
FIG. 9(b) shows the linearity error in the third embodiment of this invention.

FIG. 9(b) shows the linearity error of output (V) versus input (V) of CMOS image sensors in the present embodiment and in the prior art. Curve (a) shows the linearity error in the present embodiment. Curve ($a_1$) corresponds to a gain of 10×, curve ($a_2$) corresponds to a gain of 100×, curve ($a_3$) corresponds to a gain of 1000× and curve ($a_4$) corresponds to a gain of 10,000×. Curve (b) shows the linearity error straight line in the prior art.

From FIGS. 9(a) and 9(b) it can be seen if the gain is extremely low at about 10× (curve ($a_1$)), it is difficult to realize to improve the linearity. On the other hand, if the gain is over 100× (curves ($a_2$), ($a_3$) and ($a_4$)), a linearity significantly improved over that of the prior art is realized.

Because the back gate voltage of the transistor also depends on temperature, a simulation has been made on the influence of temperature.

Figure 10A:
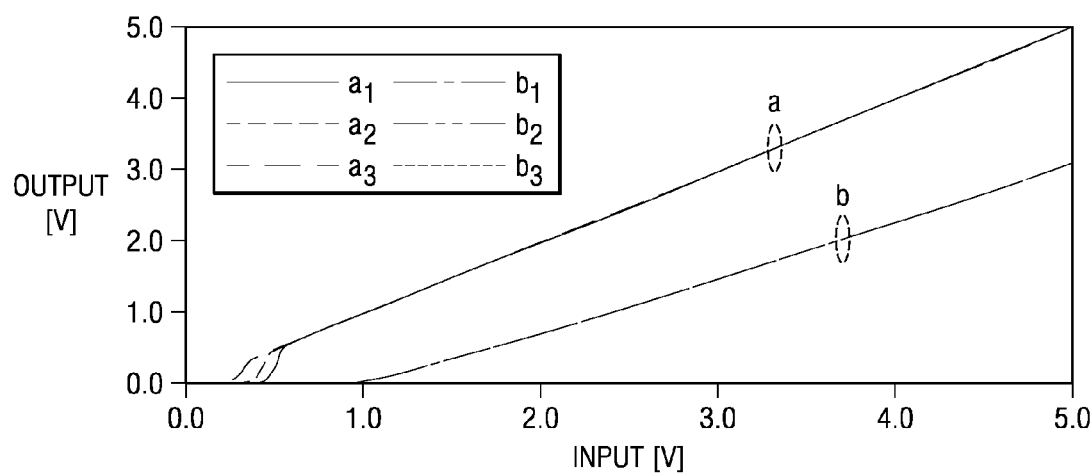
FIG. 10(a) shows the input-output curve in the fourth embodiment of this invention.

FIG. 10(a) shows output (V) versus input (V) of CMOS image sensors in the present embodiment and in the prior art. Curve (a) shows the input-output curve of the present embodiment. Curve ($a_1$) corresponds to −15° C., curve ($a_2$) corresponds to 27° C., and curve ($a_3$) corresponds to 80° C. Curve (b) shows the input-output curve in the prior art. Curve ($b_1$) corresponds to −15° C., curve ($b_2$) corresponds to 27° C., and curve ($b_3$) corresponds to 80° C.

Figure 10B:
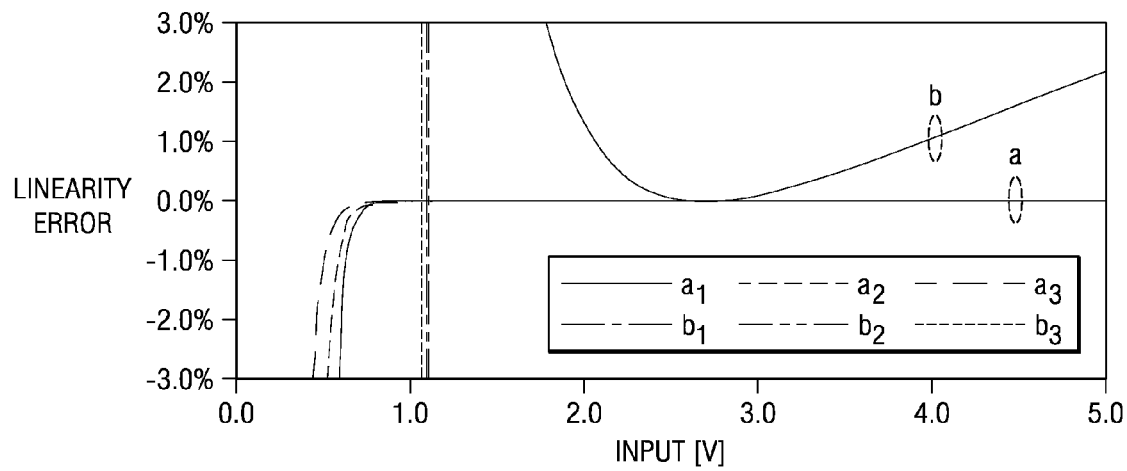
FIG. 10(b) shows the linearity error in the fourth embodiment of this invention.

FIG. 10(b) shows the linearity error of output (V) versus input (V) of the CMOS image sensors in the present embodiment and in the prior art. Curve (a) shows the linearity error of the present embodiment. Curve ($a_1$) corresponds to −15° C., curve ($a_2$) corresponds to 27° C., and curve $a_3$ corresponds to 80° C. Curve (b) shows the linearity error straight line in the prior art. Curve ($b_1$) corresponds to −15° C., curve ($b_2$) corresponds to 27° C. and curve ($b_3$) corresponds to 80° C.

In the prior art, because the output depends on the temperature, the value of the output varies as a function of the temperature increasing the dispersion. In the present embodiment, because of compensation by a transistor pair having the same characteristics formed on the same substrate, the dispersion in output with respect to variation in temperature is small improving the linearity.

Regarding power consumption, because the two transistors amplification transistor Tr4 (M1) and compensating transistor M2 are driven under the same conditions, the power consumption of this portion is double that of the prior art. However, by using the compensating circuit, a correction treatment at a latter stage can be omitted. The reduces the overall power consumption of the entire system.

The linearity of a CMOS image sensor is extremely important. If the linearity is not good, γ compensation and other post-treatments should be performed for each integrated circuit. This requires a longer testing time and a higher cost. Because the compensation parameters depend on the temperature, it is extremely difficult to perform temperature dependent compensation. In order to obtain a wide dynamic range with a CMOS image sensor in the present embodiment, it is necessary to switch between a high-gain output and a low-gain output. Consequently, if highly reliable linearity is absent in the output of each color of RGB, color drift occurs significantly degrading the image quality.

The present invention solves these problems by forming compensating circuits containing compensating transistors on the same substrate as the image pixels. The compensating transistor compensated for the variation in the threshold due to a back gate effect to improve the linearity independent of the input voltage. At the same time, the value of the gain being the magnitude of the output value with respect to the input value can in theory be increased to one, thus no gain loss is possible.

Because the compensating transistors are formed in the same manufacturing process and on the same substrate as the pixels, matching is high. Even if the outside temperature varies, because the two transistors are driven at nearly the same temperature the influence of temperature is hardly felt. Because the integrated circuit output can be compensated for linearity on board, a later stage of correction is not needed. Thus the testing time and cost are reduced. This is also an advantage.

It is preferable that pixels PX and compensating pixels CC are set adjacent to each other and have the same structure in order to compensate for linearity at high precision. It is preferred that the compensating transistors be set near the amplification transistors in the image pixels. It is preferred that the compensating transistors and the amplifiers be set with a certain spacing between them in order to match the plural amplifiers. For example, it is preferred that dummy pixels DC of 2 or 3 pixels be set between compensating pixel CC and the amplifier. The present invention is not limited to this scheme.

An embodiment was described where the solid-state image pickup device includes additive capacitance elements giving the pixels a wide dynamic range. However, the present invention is not limited to this scheme. This invention may also be used in a solid-state image pickup device with a conventional dynamic range without additive capacitance elements. Even using additive capacitance elements in the pixels, the ratio of the capacitance of the floating diffusion to that of additive capacitance elements can still be selected appropriately corresponding to the design.

This invention is not limited to a CMOS image sensor. The compensating circuit of this invention may also be used in the read mechanism that converts the charge of each pixel to a voltage.

In the above explanation, the construction of compensating pixel CC and pixel PX are the same. However, only the compensating transistor in compensating pixel CC corresponds to the amplification transistor in pixel PX effects the output operation. Thus the compensating pixel CC may be constructed in which other elements, such as diodes, etc., are not included and may be deleted. Also, the diffusion region in compensating pixel CC may be formed in the same way as in pixel PX and a metal layer not formed.

In addition, dummy pixel DC may be disposed adjacent to pixel PX and compensating pixel CC disposed adjacent to dummy pixel DC. Thus the construction may have dummy pixel DC disposed between pixel PX and compensating pixel CC.

In addition, various other modifications may be made as long as the gist of the present invention is observed.

The solid-state image pickup device of the present invention can be adopted in a CMOS image sensor, CCD image sensor, and other solid-state image pickup devices in a digital camera, a camera-attached cell phone, etc.

What is claimed is:

1. A solid-state image pickup device comprising:
   a plurality of pixels (PX) integrated in an array configuration on a semiconductor substrate; each pixel having
       a photodiode (PD) receiving light and generating and storing photoelectric charge, said photodiode (PD) having a first terminal and a second terminal connected to ground,
       a transfer transistor (Tr1) having a source-drain path with a first terminal and a second terminal connected to said first terminal of said photodiode (PD) and a gate,
       a floating diffusion (FD) having a first terminal connected to said first terminal of said source-drain path of said transfer transistor (Tr1) and a second terminal connected to ground,
       an amplification transistor (Tr4) having a gate connected to first terminal of said floating diffusion and a source-drain path having a first terminal and a second terminal connected to a pixel output line,
       a first current source (I1) conducting a first current from said pixel output line and ground;
   a compensating circuit has an amplifier having the output of said amplification transistor as input, and a compensating transistor having a gate electrode with the output of said amplifier connected to it; and the compensating circuit has negative feedback of the output of said compensating transistor to said amplifier, a second current source (I1) conducting a second current from said compensating circuit output and ground;
   wherein said amplification transistor (Tr4) having substantially the same ratio of gate width to gate length as and said compensating transistor (M2); and
   wherein first current of said first current source (Ii) for said amplification transistor (Tr4) substantially the same current as said second current of said second current source (I2) for said compensating transistor (M2).

2. The solid-state image pickup device of claim 1, wherein:
   said compensating circuit comprising one circuit for each column of said pixels (PX) integrated in said array configuration.

3. The solid-state image pickup device of claim 1, wherein:
   each pixel further includes
       a selecting transistor (Tr5) having a source-drain path having a first terminal connected to a predetermined supply voltage (VR) and a second terminal connected to said first terminal of said source-drain path of said amplification transistor (Tr4) and a gate connected to a selection line (SL).

4. The solid-state image pickup device of claim 1, wherein:
   each pixel further includes
       an additive capacitance element (Cs) having a first terminal and a second terminal connected to ground, and
       a capacitive coupling transistor (Tr2) having a source-drain path with a first terminal connected to said first terminal of said additive capacitance element (Cs) and a second terminal connected to said first terminal of said floating diffusion and a gate connected to a first driving line ($\phi_S$).

5. The solid-state image pickup device of claim 4, wherein:
   each pixel further includes
       a reset transistor (Tr3) having a source-drain path with a first terminal connected to a predetermined supply voltage (VR) and a second terminal connected to said first terminal of said additive capacitance element (Cs) and a gate connected to a second driving line ($\phi_R$).

6. A solid-state image pickup device comprising:
   a matrix of M×N image pickup elements, M and N being integers greater that 2, each image pickup element having
       a photodiode (PD) receiving light and generating and storing photoelectric charge, said photodiode (PD) having a first terminal and a second terminal connected to ground,
       a transfer transistor (Tr1) having a source-drain path with a first terminal and a second terminal connected to said first terminal of said photodiode (PD) and a gate,
       a floating diffusion (FD) having a first terminal connected to said first terminal of said source-drain path of said transfer transistor (Tr1) and a second terminal connected to ground,
       a reset transistor (Tr3) having a source-drain path with a first terminal connected to a predetermined supply voltage (VR) and a second terminal connected to said first terminal of said additive capacitance element (Cs) and a gate connected to a second driving line ($\phi_R$)
       an amplification transistor (Tr4) having a gate connected to first terminal of said floating diffusion and a source-drain path having a first terminal and a second terminal connected to a corresponding column pixel output line,
       a selecting transistor (Tr5) having a source-drain path having a first terminal connected to a predetermined supply voltage (VR) and a second terminal connected to said first terminal of said source-drain path of said amplification transistor (Tr4) and a gate connected to a corresponding selection line (SL); and
   N output circuits, each output circuit having an input connected a corresponding column pixel output line thereby responsive to image pickup elements of the Mth row as selected by a corresponding Mth selection line (SL) and an output, each output circuit including
       an amplifier (AP) having a first input receiving the output of a corresponding amplification transistor (Tr4) via said corresponding column pixel output line, a second input and an output, and
       an output transistor (M2) having a source-drain path with a first terminal connected to a predetermined supply voltage (VR) and a second terminal connected to a corresponding current source (I2) and to said second input of said amplifier (AP) and a gate connected to said output of said amplifier (AP).

7. The solid-state image pickup device of claim 6, wherein:
   said output transistor (M2) of each output circuit having a construction identical to said amplification transistor (Tr4) of said image pickup element.

8. The solid-state image pickup device of claim 7, wherein:
   said N output elements are disposed adjacent to said image pickup elements of said corresponding row.

9. The solid-state image pickup device of claim 6, wherein:
said amplifier (AP) is an operational amplifier having an inverting input terminal connected to an output of said output transistor (M2) and an non-inverting input terminal connected to output of said amplification transistor (Tr4).

10. A solid-state image pickup device comprising:
a matrix of M×N image pickup elements, M and N being integers greater that 2, each image pickup element having
  a photodiode (PD) receiving light and generating and storing photoelectric charge, said photodiode (PD) having a first terminal and a second terminal connected to ground,
  a transfer transistor (Tr1) having a source-drain path with a first terminal and a second terminal connected to said first terminal of said photodiode (PD) and a gate,
  a floating diffusion (FD) having a first terminal connected to said first terminal of said source-drain path of said transfer transistor (Tr1) and a second terminal connected to ground,
  a reset transistor (Tr3) having a source-drain path with a first terminal connected to a predetermined supply voltage (VR) and a second terminal connected to said first terminal of said additive capacitance element (Cs) and a gate connected to a second driving line ($\phi_R$)
  an amplification transistor (Tr4) having a gate connected to first terminal of said floating diffusion and a source-drain path having a first terminal and a second terminal connected to a column pixel output line; and
N output circuits, each output circuit having an input connected a corresponding column pixel output line thereby responsive to image pickup elements of a selected one of a first to (M−1)th row, a second input connected to a corresponding column pixel output line of and Mth row, each output circuit including
  an amplifier (AP) having a first input receiving the output of a corresponding amplification transistor (Tr4) via said corresponding column pixel output line, a second input and an output, and
  an output transistor (M2) having a source-drain path with a first terminal connected to a predetermined supply voltage (VR) and a second terminal connected to a corresponding current source and a gate connected to said output of said amplifier (AP).

11. The solid-state image pickup device of claim 10, wherein:
said amplifier (AP) is an operational amplifier, said first input is an inverting input terminal connected to an output of said output transistor (M2) and said second input is an non-inverting input terminal connected to output of said amplification transistor (Tr4).

12. The solid-state image pickup device of claim 10, further comprising:
plural rows of dummy pixels having N dummy pixels in each row disposed between said pixel regions and said N amplifiers.

13. A solid-state image pickup device comprising:
a plurality of pixels (PX) integrated in an array configuration on a semiconductor substrate; each pixel having
  a photodiode (PD) receiving light and generating and storing photoelectric charge, said photodiode (PD) having a first terminal and a second terminal connected to ground,
  a transfer transistor (Tr1) having a source-drain path with a first terminal and a second terminal connected to said first terminal of said photodiode (PD) and a gate,
  a floating diffusion (FD) having a first terminal connected to said first terminal of said source-drain path of said transfer transistor (Tr1) and a second terminal connected to ground,
  an amplification transistor (Tr4) having a gate connected to first terminal of said floating diffusion and a source-drain path having a first terminal and a second terminal connected to a pixel output line; and
a compensating circuit has an amplifier having the output of said amplification transistor as input, and a compensating transistor having a gate electrode with the output of said amplifier connected to it; and the compensating circuit has negative feedback of the output of said compensating transistor to said amplifier, said compensating circuit comprising one circuit for each column of said pixels (PX) integrated in said array configuration.

14. The solid-state image pickup device of claim 13, wherein:
each pixel further includes
  an additive capacitance element (Cs) having a first terminal and a second terminal connected to ground, and
  a capacitive coupling transistor (Tr2) having a source-drain path with a first terminal connected to said first terminal of said additive capacitance element (Cs) and a second terminal connected to said first terminal of said floating diffusion and a gate connected to a first driving line ($\phi_S$).

15. The solid-state image pickup device of claim 14, wherein:
each pixel further includes
  a reset transistor (Tr3) having a source-drain path with a first terminal connected to a predetermined supply voltage (VR) and a second terminal connected to said first terminal of said additive capacitance element (Cs) and a gate connected to a second driving line ($\phi_R$).

16. A solid-state image pickup device comprising:
a plurality of pixels (PX) integrated in an array configuration on a semiconductor substrate; each pixel having
  a photodiode (PD) receiving light and generating and storing photoelectric charge, said photodiode (PD) having a first terminal and a second terminal connected to ground,
  a transfer transistor (Tr1) having a source-drain path with a first terminal and a second terminal connected to said first terminal of said photodiode (PD) and a gate,
  a floating diffusion (FD) having a first terminal connected to said first terminal of said source-drain path of said transfer transistor (Tr1) and a second terminal connected to ground,
  an amplification transistor (Tr4) having a gate connected to first terminal of said floating diffusion and a source-drain path having a first terminal and a second terminal connected to a pixel output line,
  an additive capacitance element (Cs) having a first terminal and a second terminal connected to ground, and
  a capacitive coupling transistor (Tr2) having a source-drain path with a first terminal connected to said first terminal of said additive capacitance element (Cs) and a second terminal connected to said first terminal of said floating diffusion and a gate connected to a first driving line ($\phi_S$); and a compensating circuit has an amplifier having the output of said amplification transistor as input, and a compensating transistor having a gate electrode with the output of said amplifier connected to it; and the constitution has negative feedback of the output of said compensating transistor to said amplifier.

17. The solid-state image pickup device of claim 16, wherein:

each pixel further includes
a reset transistor (Tr3) having a source-drain path with a first terminal connected to a predetermined supply voltage (VR) and a second terminal connected to said first terminal of said additive capacitance element (Cs) and a gate connected to a second driving line ($\phi_R$).

* * * * *